(12) United States Patent
Hiromoto et al.

(10) Patent No.: US 7,638,860 B2
(45) Date of Patent: Dec. 29, 2009

(54) SEMICONDUCTOR DEVICE AND LEAD FRAME

(75) Inventors: Hideki Hiromoto, Kyoto (JP); Sadamasa Fujii, Kyoto (JP); Tsunemori Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 64 days.

(21) Appl. No.: 11/918,410

(22) PCT Filed: Apr. 12, 2006

(86) PCT No.: PCT/JP2006/307762

§ 371 (c)(1),
(2), (4) Date: Oct. 12, 2007

(87) PCT Pub. No.: WO2006/112332

PCT Pub. Date: Oct. 26, 2006

(65) Prior Publication Data

US 2009/0032919 A1 Feb. 5, 2009

(30) Foreign Application Priority Data

Apr. 13, 2005 (JP) ............................... 2005-116051

(51) Int. Cl.
*H01L 23/52* (2006.01)
(52) U.S. Cl. ................................ 257/666; 257/E23.037
(58) Field of Classification Search .................. 257/666
See application file for complete search history.

(56) References Cited

U.S. PATENT DOCUMENTS

| 2001/0035569 | A1 | 11/2001 | Shibata |
| 2002/0050640 | A1 | 5/2002 | Nakashima et al. |
| 2002/0163015 | A1 | 11/2002 | Lee et al. |
| 2004/0056337 | A1* | 3/2004 | Hasebe et al. ................ 257/667 |
| 2007/0052070 | A1* | 3/2007 | Islam et al. .................. 257/666 |
| 2007/0075404 | A1* | 4/2007 | Dimaano et al. ............. 257/666 |
| 2007/0296069 | A1* | 12/2007 | Terui et al. ................... 257/676 |

FOREIGN PATENT DOCUMENTS

| JP | 10-247701 | 9/1998 |
| JP | 2000-252403 | 9/2000 |
| JP | 2001-313363 | 11/2001 |
| JP | 2002-016206 | 1/2002 |
| JP | 2004-522297 | 7/2004 |

* cited by examiner

*Primary Examiner*—Nathan W Ha
(74) *Attorney, Agent, or Firm*—Rabin & Berdo, PC

(57) ABSTRACT

A semiconductor device which can surely prevent a wire bonded to an island from breaking due to, for instance, thermal shock and temperature cycle upon mounting. The semiconductor device includes a semiconductor chip; an island die bonded with the semiconductor chip on the surface; and a wire for electrically connecting the electrode formed on the surface of the semiconductor chip with the island. The semiconductor device is further characterized in that the island has a die bonding region where the semiconductor chip is die bonded, a wire bonding region where the wire is wire bonded, and a continuous groove reaching a circumference of the island are formed between the die bonding region and the wire bonding region of the island.

10 Claims, 6 Drawing Sheets

FIG. 2 ( a )
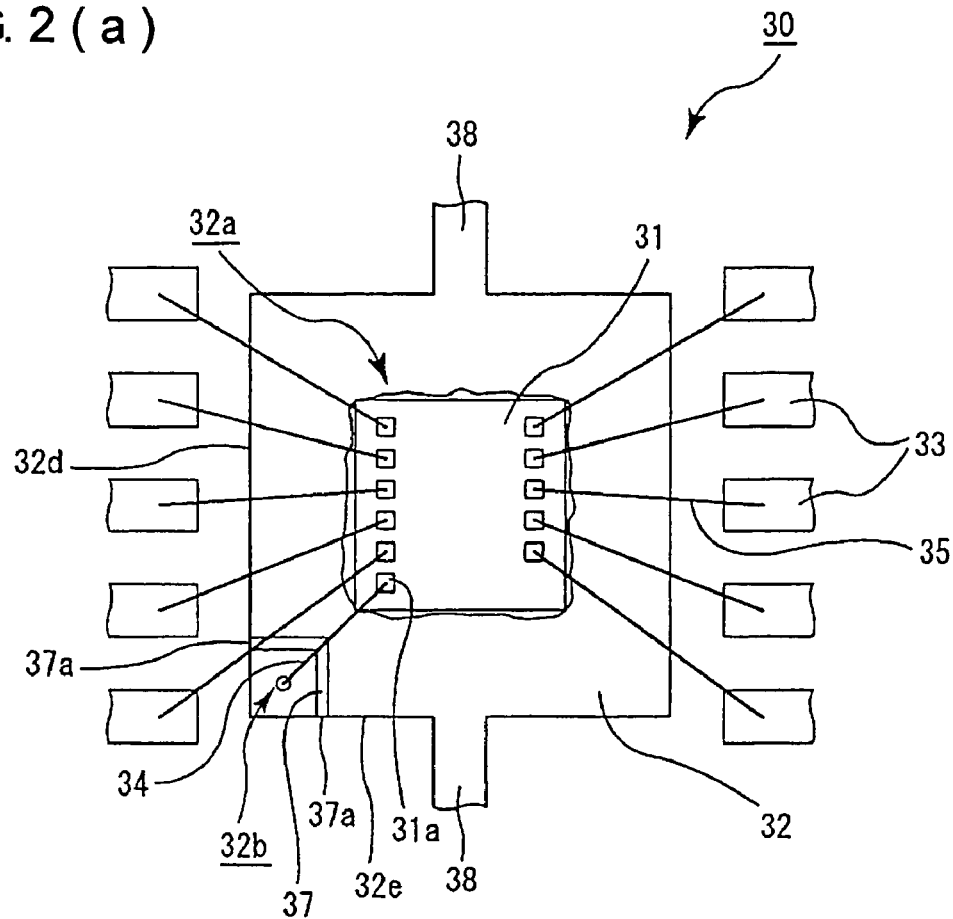
FIG. 2 ( b )
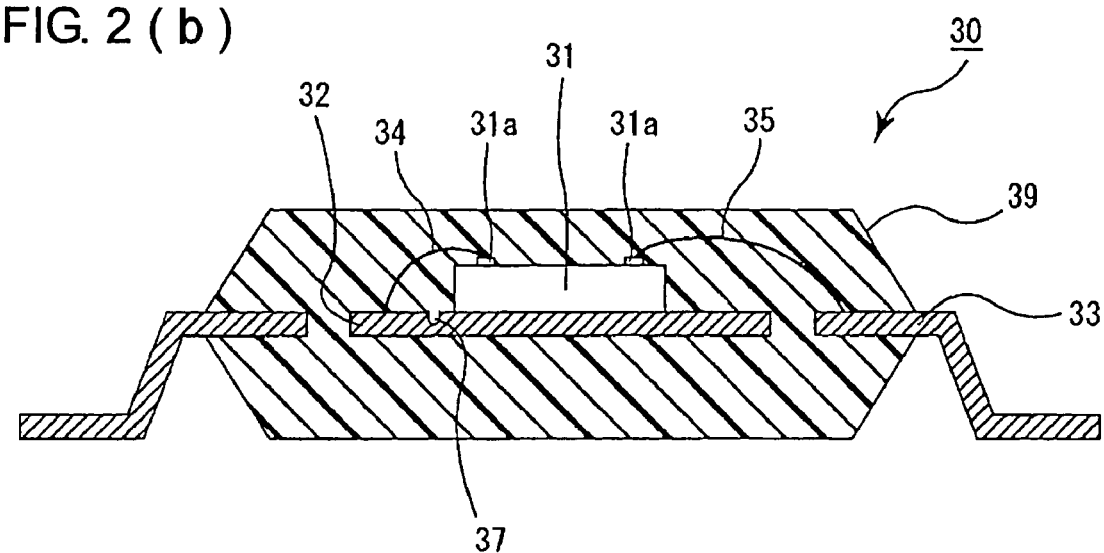

FIG. 5 ( a )
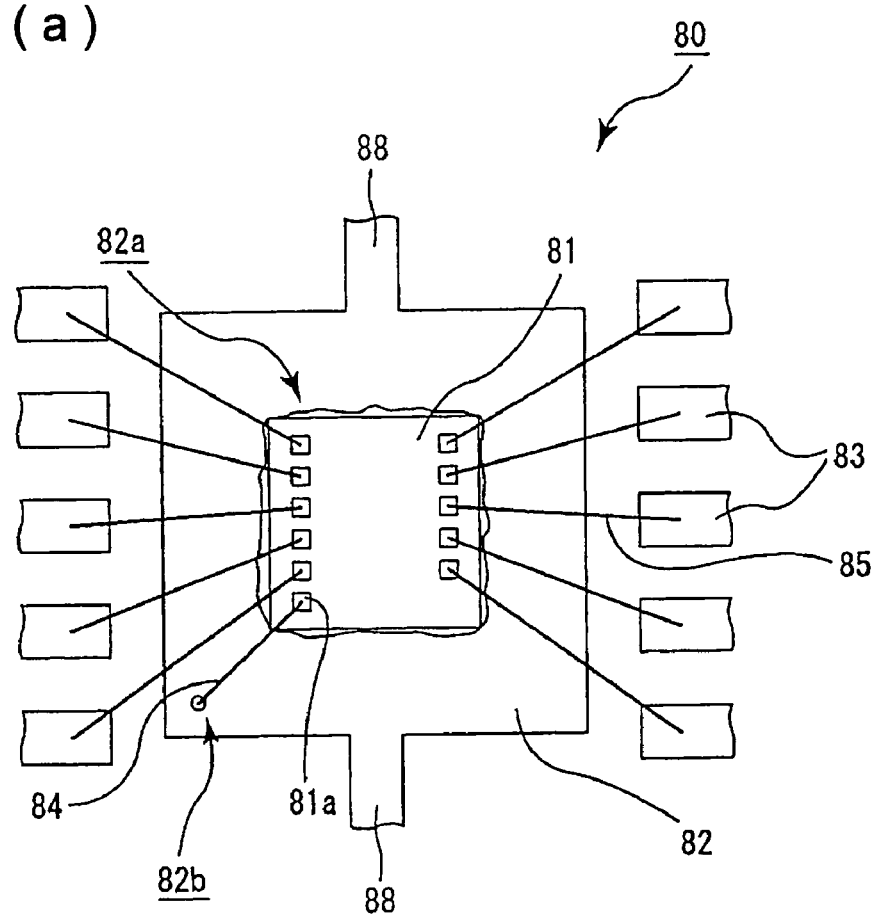
FIG. 5 ( b )
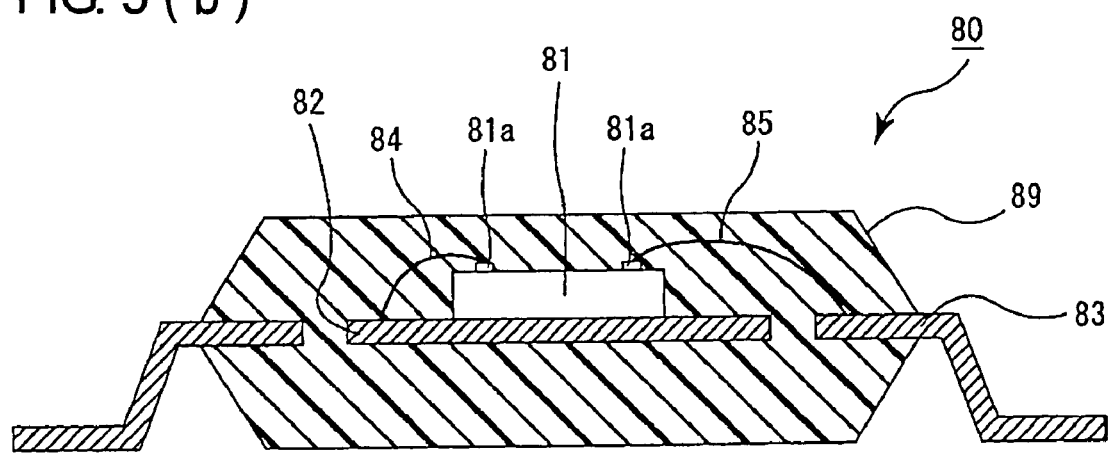

FIG. 6 ( a )
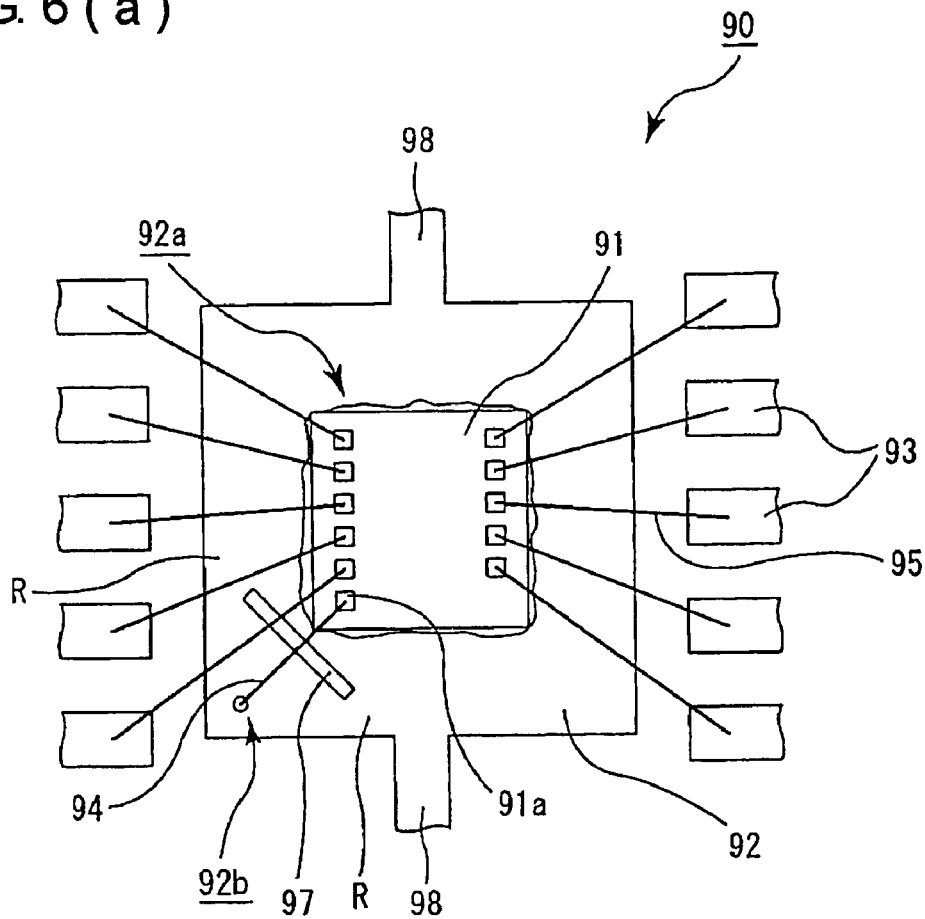
FIG. 6 ( b )
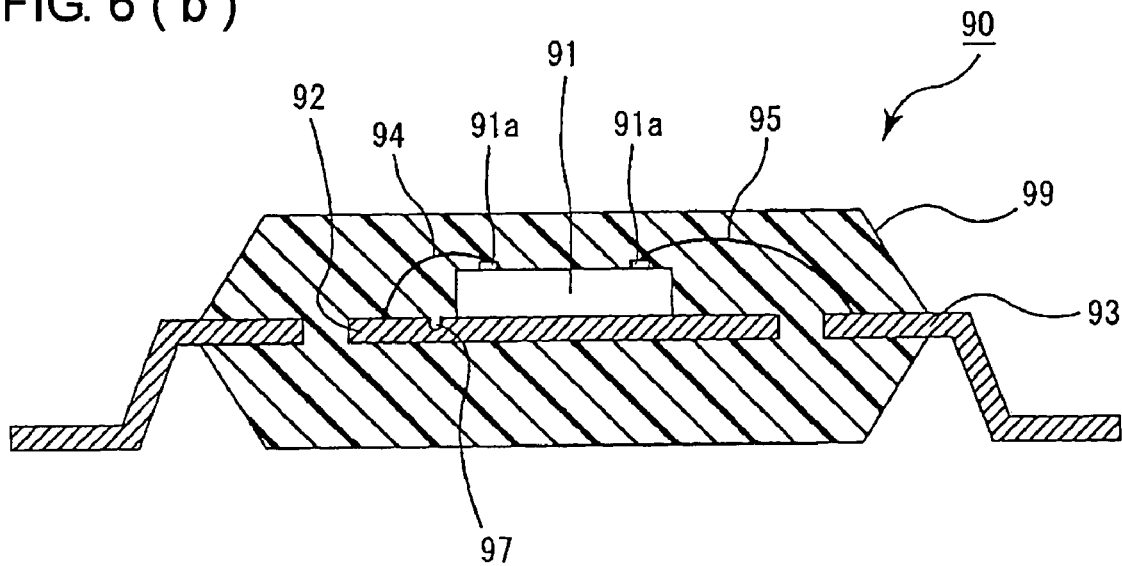

SEMICONDUCTOR DEVICE AND LEAD FRAME

TECHNICAL FIELD

The present application claims a priority of the basic application of Japanese Patent Application No. 2005-116051 filed on Apr. 13, 2005.

The present invention relates to a semiconductor device and a lead frame.

BACKGROUND ART

Conventionally, semiconductor devices provided with semiconductor chips such as LSIs include a semiconductor device for which a semiconductor chip is die bonded to an island, and an electrode formed on the upper surface of this semiconductor chip and the island are connected by a wire. Such a semiconductor device will be described by use of FIG. 5.

FIG. 5(*a*) is a partial plan perspective view schematically showing an example of a conventional semiconductor device. FIG. 5(*b*) is a longitudinal sectional view schematically showing the semiconductor device.

As shown in FIGS. 5(*a*) and 5(B), a semiconductor device 80 includes a semiconductor chip 81 formed with a plurality of electrodes 81*a* on the surface, an island 82 die bonded with the semiconductor chip 81 on the surface, a plurality of lead terminals 83, a first wire 84 that electrically connects the electrode 81*a* with the island 82, a second wire 85 that electrically connects the electrode 81*a* with the lead terminal 83, a suspension lead 88 connected to the island 82, and a resin package portion 89 that seals these components. In the figures, reference numeral 82*a* denotes a die bonding region where the semiconductor chip 81 is die bonded, and reference numeral 82*b* denotes a wire bonding region where the first wire 84 is wire bonded. In FIG. 5(*a*), the resin package portion 89 is not shown.

The semiconductor device 80 shown in FIG. 5 is, for example, mounted on a printed circuit board or the like by solder reflow. However, the island 82 and the resin package portion 89 expand according to their intrinsic thermal expansion coefficients, respectively, when heated at the time of mounting. Accordingly, due to a difference in the thermal expansion coefficients between the wire bonding region 82*b* and the resin package portion 89, a relative slip is produced at an interface between the wire bonding region 82*b* and the resin package portion 89, so that the first wire 84 may be broken.

In order to solve such a problem, conventionally, there have been provided, for example, semiconductor devices having grooves or holes formed between the die bonding region and the wire bonding region of the island (see Patent Documents 1 and 2, for example). Such a semiconductor device will be described by use of FIGS. 6(*a*) and 6(*b*). FIG. 6(*a*) is a partial plan perspective view schematically showing another example of a conventional semiconductor device, and FIG. 6(*b*) is a longitudinal sectional view schematically showing the semiconductor device.

A semiconductor device 90 includes a semiconductor chip 91 formed with a plurality of electrodes 91*a* on the surface, an island 92 die bonded with the semiconductor chip 91 on the surface, a plurality of lead terminals 93, a first wire 94 that electrically connects the electrode 91*a* with the island 92, a second wire 95 that electrically connects the electrode 91*a* with the lead terminal 93, a suspension lead 98 connected to the island 92, and a resin package portion 99 that seals these components. In the figures, reference numeral 92*a* denotes a die bonding region where the semiconductor chip 91 is die bonded, and reference numeral 92*b* denotes a wire bonding region where the first wire 94 is wire bonded. In the semiconductor device 90, a groove 97 is formed between the die bonding region 92*a* and the wire bonding region 92*b* of the island 92. In FIG. 6(*a*), the resin package portion 99 is not shown.

According to the semiconductor device 90 shown in FIGS. 6(*a*) and 6(*b*), since the groove 97 is formed between the die bonding region 92*a* and the wire bonding region 9*b* of the island 92 and the resin package portion 99 is filled in the groove 97, the die bonding region 92*a* and the wire bonding region 92*b* thermally expand individually independent of each other when heated at the time of mounting. Accordingly, a thermal expansion produced in the wire bonding region 92*b* is reduced, so that the first wire 94 is less likely to break.

Patent Document 1: Japanese Unexamined Patent Publication No. 2001-313363

Patent Document 2: Japanese Unexamined Patent Publication No. 2002-16206

DISCLOSURE OF THE INVENTION

Problems to be Solved by the Invention

However, as shown in FIG. 6(*a*), in the semiconductor devices described in Patent Documents 1 and 2, since a region R where the die bonding region 92*a* and the wire bonding region 92*b* continuously exist on the surface of the island 92, a thermal expansion of the die bonding region 92*a* is transmitted to the wire bonding region 92*b* via the region R. As a result, there has been a problem that displacement of the wire bonding region 92 due to the thermal expansion of the die bonding region 92*a* cannot be sufficiently suppressed. Accordingly, a relative slip is produced at an interface between the wire bonding region 92*b* and the resin package portion 99, so that the first wire 94 may be broken. As is described, in the semiconductor devices described in Patent Documents 1 and 2, there has still been room for improvement that it is difficult to reliably prevent the first wire 94 from breaking.

The present invention is made in view of the problems described above, and an object thereof is to provide a semiconductor device which can reliably prevent a wire that is wire bonded to an island from breaking due to, for instance, thermal shock and temperature cycle at the time of mounting and a lead frame used for the semiconductor device.

Means for Solving the Problems

In order to solve the above-described problems, the present invention provides the following.

(1) A semiconductor device including:
a semiconductor chip;
an island die bonded with the semiconductor chip on a surface; and
a wire that electrically connects an electrode formed on a surface of the semiconductor chip with the island, wherein
the island has a die bonding region where a semiconductor chip is die bonded and a wire bonding region where the wire is wire bonded, and
a continuous groove reaching a circumference of the island is formed between the die bonding region and the wire bonding region of the island.

According to invention (1), since a continuous groove reaching a circumference of the island is formed between the die bonding region and the wire bonding region of the island, the die bonding region is isolated from the wire bonding region by the groove. Accordingly, when the semiconductor device is heated, the die bonding region and the wire bonding region thermally expand individually independent of each other, so that a thermal expansion produced in the wire bonding region can be reduced. In addition, since a thermal expansion produced in the die bonding region when the semiconductor device is heated is absorbed by the groove that isolates the die bonding region from the wire bonding region and is not transmitted to the wire bonding region, displacement of the wire bonding region itself due to a thermal expansion of the die bonding region can be suppressed. Furthermore, since the wire bonding region is to be surrounded at its circumference by the resin that covers the circumference of the island and the resin filled in the groove, this results in a less slip produced at an interface between the wire bonding region and the resin.

Thus, according to invention (1), a thermal expansion produced in the wire bonding region can be reduced, displacement of the wire bonding region itself due to a thermal expansion of the die bonding region can be suppressed. Further, a slip can be less likely to be produced at the interface between the wire bonding region and the resin, whereby the wire can be reliably prevented from breaking.

Further, the present invention provides the following.

(2) The semiconductor device according to the (1), wherein
the island is a rectangular shape, and
the groove is a continuous groove reaching each of two adjacent sides of the island.

According to invention (2), since a continuous groove reaching each of two adjacent sides of the island is formed in the island and the die bonding region is isolated from the wire bonding region by the groove, displacement of the wire bonding region due to a thermal expansion of the wire bonding region itself can be further reduced, and displacement of the wire bonding region due to a thermal expansion of the die bonding region can be further reduced.

The reason for this will be described in the following.

A thermal expansion produced in the island when the semiconductor device is heated is a planar thermal expansion that acts mainly in a direction to planarly extend the island. It can be said that this planar thermal expansion is composed of two directional components, that is, a thermal expansion in the longitudinal direction and a thermal expansion in the transverse direction. In the present invention, since the die bonding region and the wire bonding region of the island are isolated by the groove, the above-described planar thermal expansion is produced in the die bonding region and the wire bonding region individually and independently. According to invention (2), since a continuous groove reaching each of two adjacent sides of the island is formed between the die bonding region and the wire bonding region and the die bonding region and the wire bonding region are isolated by the groove in the longitudinal direction and transverse direction, thermal expansions in the longitudinal direction and the transverse direction produced in the wire bonding region can be absorbed by the groove. Accordingly, displacement of the wire bonding region due to a thermal expansion of the wire bonding region itself can be reduced. In addition, since thermal expansions in the vertical direction and the transverse direction produced in the die bonding region are absorbed by a groove that isolate the die bonding region and the wire bonding region in the longitudinal direction and the transverse direction and are not transmitted to the wire bonding region, displacement of the wire bonding region itself due to a thermal expansion of the die bonding region can be reduced.

Thus, according to invention (2), since a continuous groove reaching each of two adjacent sides of the island is formed in the island and it is possible to absorb a planar thermal expansion produced in each of the die bonding region and the wire bonding region by the groove, displacement of the wire bonding region due to a thermal expansion of the wire bonding region itself can be reduced. In addition, it is possible to reduce displacement of the wire bonding region itself due to a thermal expansion of the die bonding region, so that the wire can be more reliably prevented from breaking.

Further, the present invention provides the following.

(3) A lead frame including:
an island having a die bonding region where a semiconductor chip is die bonded and a wire bonding region where a wire is wire bonded, wherein
a continuous groove reaching a circumference of the island is formed between the die bonding region and the wire bonding region of the island.

According to invention (3), since a continuous groove reaching a circumference of the island is formed between the die bonding region and the wire bonding region of the island, the die bonding region is isolated from the wire bonding region by the groove. Accordingly, the die bonding region and the wire bonding region thermally expand individually independent of each other, so that a thermal expansion of the wire bonding region itself can be reduced. In addition, since a thermal expansion produced in the die bonding region is absorbed by the groove that isolates the die bonding region from the wire bonding region and is not transmitted to the wire bonding region, displacement of the wire bonding region itself due to a thermal expansion of the die bonding region can be suppressed. Furthermore, since the wire bonding region is to be surrounded at its circumference by the resin that covers the circumference of the island and the resin filled in the groove, this results in a less slip produced at an interface between the wire bonding region and the resin.

Accordingly, by manufacturing a semiconductor device using this lead frame, the wire can be reliably prevented from breaking in the semiconductor device.

Further, the present invention provides the following.

(4) The lead frame according to (3), wherein
the island is a rectangular shape, and
the groove is a continuous groove reaching each of two adjacent sides of the island.

According to invention (4), since a continuous groove reaching each of two adjacent sides of the island is formed in the island and it is possible to absorb a planar thermal expansion produced in each of the die bonding region and the wire bonding region by the groove, displacement of the wire bonding region due to a thermal expansion of the wire bonding region itself can be reduced, and it is possible to reduce displacement of the wire bonding region itself due to a thermal expansion of the die bonding region. Accordingly, by manufacturing a semiconductor device using this lead frame, the wire can be more reliably prevented from breaking in the semiconductor device.

EFFECTS OF THE INVENTION

According to the present invention, a semiconductor device which can reliably prevent a wire bonded to an island from breaking due to, for instance, thermal shock and temperature cycle at the time of mounting and a lead frame used for the semiconductor device can be provided.

BEST MODE FOR CARRYING OUT THE INVENTION

An example of a semiconductor device according to the present invention will be described by use of the drawings.

FIG. 1(a) is a plan perspective view schematically showing an example of a semiconductor device according to the present invention, and FIG. 1(b) is a longitudinal sectional view schematically showing the semiconductor device.

A semiconductor device 10 includes a semiconductor chip 11, an island 12, a lead terminal 13, a first wire 14, a second wire 15, a suspension lead 18, and a resin package 19. However, in FIG. 1(a), the resin package portion 19 is not shown.

The semiconductor device 10 includes the semiconductor chip 11 formed with a plurality of electrodes 11a on the surface. As the semiconductor chip 11, various chips can be used, and its specific function and internal circuit configuration are not particularly limited. The semiconductor chip 11 is die bonded to a die bonding region 12a located at generally the center of the island 12 by, for example, an epoxy adhesive or the like. In addition, the electrode 11a formed on the surface of the semiconductor chip 11 and the wire bonding region 12b located at a corner of the island 12 are electrically connected by the first wire 14. In addition, around the island 12, a plurality of lead terminals 13 are arranged at a predetermined distance from the island 12. The electrode 11a formed on the surface of the semiconductor chip 11 and the lead terminal 13 are electrically connected by the second wire 15. On the semiconductor device 10, the resin package portion 19 is formed that seals the semiconductor chip 11 and the like with exposing the lead terminals 13 only partially. The resin package portion 19 is formed of, for example, a resin composition containing an epoxy resin and the like.

A continuous groove 17 having a linear shape in a plan view and reaching a circumference 12c of the island 12 is formed between the die bonding region 12a and the wire bonding region 12b of the island 12. The groove 17 isolates the die bonding region 12a from the wire bonding region 12b, and the resin package portion 19 is filled in the groove 17. In the figure, reference numeral 17a denotes an opening formed at the circumference 12c of the island 12 by the groove 17.

The groove 17 is formed by etching, and has a U-shape in a section view. The depth of the groove 17 is, for example, ½ to ⅔ of the thickness of the island 12, and the width of the groove 17 is generally the same as the depth of the groove 17. Further, in the present invention, a forming method of the groove is not particularly limited, and the groove may be formed, for example, by coining, and may be formed by a laser. By forming the groove by coining, a groove having a V-shape in a section view can be formed.

According to the semiconductor device 10, since the continuous groove 17 reaching the circumference 12c of the island 12 is formed between the die bonding region 12a and the wire bonding region 12b of the island 12, the die bonding region 12a is isolated from the wire bonding region 12b by the groove 17. Accordingly, when the semiconductor device 10 is heated, the die bonding region 12a and the wire bonding region 12b thermally expand individually independent of each other, so that a thermal expansion produced in the wire bonding region 12b can be reduced. In addition, since the thermal expansion produced in the die bonding region 12a when the semiconductor device 10 is heated is absorbed by the groove 17 that isolates the die bonding region 12a from the wire bonding region 12b and is not transmitted to the wire bonding region 12b. Accordingly, displacement of the wire bonding region 12b itself due to the thermal expansion of the die bonding region 12a can be suppressed. Furthermore, since the wire bonding region 12b is to be surrounded at its circumference by the resin package portion 19 that covers the circumference 12c of the island 12 and the resin package portion 19 filled in the groove 17, this can result in a less slip produced at an interface between the wire bonding region 12b and the resin package portion 19. Thus, according to the semiconductor device 10, the thermal expansion produced in the wire bonding region 12b can be reduced, and displacement of the wire bonding region 12b itself due to a thermal expansion of the die bonding region 12a can be suppressed. Further, surrounding the circumference of the wire bonding region 12b with the resin package portion 19 result in a less slip produced at the interface between the wire bonding region 12b and the resin package portion 19, whereby the first wire 14 can be reliably prevented from breaking.

In addition, since the continuous groove 17 reaching the circumference 12c of the island 12 is formed between the die bonding region 12a and the wire bonding 12b, a thermal expansion on the lower surface side of the island 12 becomes greater than that on the upper surface side of the island 12 when the semiconductor device 10 is heated. In addition, since the groove 17 reaches the circumference 12c of the island 12, a warp with its upper surface recessed is likely to be produced in the island 12 while a warp with its upper surface protruded is less likely to be produced. Thus, in the semiconductor device 10, since the continuous groove 17 reaching the circumference 12c of the island 12 is formed in the upper surface of the island 12, this can prevent the first wire 14 from breaking due to a warp produced in the island 12 with its upper surface protruded.

Furthermore, since the openings 17a are formed at the circumference 12c of the island 12 by the groove 17, in sealing by a resin, air can be released from the openings 17a, so that bite of the resin into the groove 17 can be strengthened.

Next, another example of a semiconductor device according to the present invention will be described by use of the drawings.

FIG. 2(a) is a plan perspective view schematically showing another example of a semiconductor device according to the present invention, and FIG. 2(b) is a longitudinal sectional view schematically showing the semiconductor device.

A semiconductor device 30 includes a semiconductor chip 31 formed with a plurality of electrodes 31a on the surface, an island 32 die bonded with a semiconductor chip 31 on the surface by an epoxy adhesive or the like, a plurality of lead terminals 33, a first wire 34 that electrically connects the electrode 31a with the island 32, a second wire 35 that electrically connects the electrode 31a with the lead terminal 33, a suspension lead 38 connected to the island 32, and a resin package portion 39 that seals these components. In the figures, reference numeral 32a denotes a die bonding region where the semiconductor chip 31 is die bonded, and reference numeral 32b denotes a wire bonding region where the first wire 34 is wire bonded. In FIG. 2(a), the resin package portion 39 is not shown.

A continuous groove 37 reaching each of two adjacent sides 32d and 32e of the island 32 is formed between the die bonding region 32a and the wire bonding region 32b of the island 32. The die bonding region 32a is isolated from the wire bonding region 32b by the groove 37, and the resin package portion 39 is filled in the groove 37. The groove 37 is formed by etching, and has a U-shape in a section view.

In the figures, reference numeral 37a denotes an opening formed at side surfaces of the two sides 32d and 32e of the island 32 by the groove 37.

According to the semiconductor device 30, since the continuous groove 37 reaching each of the two adjacent sides 32d and 32e of the island 32 is formed in the island 32 and it is possible to absorb a planar thermal expansion produced in each of the die bonding region 32a and the wire bonding region 32b by the groove 37, displacement of the wire bonding region 32b due to a thermal expansion of the wire bonding region 32b itself can be reduced, and it is possible to reduce displacement of the wire bonding region 32b itself due to a thermal expansion of the die bonding region 32a. Accordingly, the first wire 34 can be more reliably prevented from breaking.

Furthermore, since the openings 37a are formed at the side surfaces of the two sides 32d and 32e of the island 32 by the groove 37, in sealing by a resin, air can be released from the openings 37a, so that bite of the resin into the groove 37 can be strengthened.

Next, a lead frame of the present invention will be described.

FIG. 3 is a plan view schematically showing an example of a lead frame according to the repent invention.

A lead frame 50 includes two side frames 51 arranged parallel to each other, a rectangular island 52 arranged in the middle of the two side frames 51, a plurality of lead terminals 53 that extend toward the island 52, a dam member 54 integrally provided so as to extend in a direction orthogonal to the longitudinal direction of each lead terminal 53, and a suspension lead 58 integrally provided so as to connect the side frame 51 with the island 52.

A groove 57 having a linear shape in a plan view and reaching a circumference of the island 52 is formed in the island 52, and the island 52 is positioned by the groove 57 into a die bonding region 52a where a semiconductor chip is die bonded and a wire bonding region 52b where a wire is wire bonded.

By using the lead frame 50 shown in FIG. 3, the semiconductor device 10 (see FIG. 1) that can prevent the first wire 14 from breaking can be manufactured.

FIG. 4 is a plan view schematically showing another example of a lead frame according to the present invention.

A lead frame 60 includes two side frames 61 arranged parallel to each other, a rectangular island 62 arranged in the middle of the two side frames 61, a plurality of lead terminals 63 that extend toward the island 62, a dam member 64 integrally provided so as to extend in a direction orthogonal to the longitudinal direction of each lead terminal 63, and a suspension lead 68 integrally provided so as to connect the side frame 61 with the island 62.

A continuous groove 67 reaching two adjacent sides of the island 62 is formed in the island 62, and the island 62 is positioned by the groove 67 into a die bonding region 62a where a semiconductor chip is die bonded and a wire bonding region 62b where a wire is wire bonded.

Using the lead frame 60 shown in FIG. 4, the semiconductor device 30 (see FIG. 2) that can more reliably prevent the first wire 34 from breaking can be manufactured.

Now, a manufacturing method of a semiconductor device of the present invention will be described by use of FIG. 1 and FIG. 3.

First, the lead frame 50 having the groove 57 formed in the island 52 is manufactured. A forming method of the groove 57 is not particularly limited, and the groove 57 can be formed by a method such as, for example, etching, coining, and laser machining. Next, onto the die bonding region 52a of the island 52, the semiconductor chip 11 is die bonded by, for example, an epoxy adhesive.

Subsequently, the electrode 11a formed on the surface of the semiconductor chip 11 and the wire bonding region 52b of the island 52 are wire bonded by use of the first wire 14 such as a gold wire. Further, the electrode 11a and the lead terminal 53 are wire bonded by use of the second wire 15 such as a gold wire. Subsequently, as in a manner sealing the semiconductor chip 11 and the like with exposing the lead terminals 53 partially, the resin package portion 19 is formed using a resin composition containing an epoxy resin and the like. Then, by cutting the side frames 51, the dam members 54, and the like to divide the lead frame 50, the semiconductor device 10 can be manufactured.

In the above, although the embodiment of the semiconductor device and the lead frame of the present invention has been described, the semiconductor device and the lead frame of the present invention are not limited to the examples described above.

In the present invention, the groove formed in the island is not particularly limited in its shape in a plan view as long as it is a continuous groove reaching the circumference of the island. However, as described above, a continuous groove reaching each of two adjacent sides of a rectangular island is desirable (see FIG. 2). This is because displacement of the wire bonding region due to a thermal expansion can be reduced, and it is possible to reduce displacement of the wire bonding region itself due to a thermal expansion of the die bonding region, so that the wire can be more reliably prevented from breaking.

In addition, when the groove formed in the island is a continuous groove reaching each of two adjacent sides of a rectangular island, the shape of the groove in a plan view is not particularly limited. Besides the shape shown in FIG. 2, Examples of such type may include an arc shape centered on a corner of the island. In such a case, a planar thermal expansion radiating from the center of the die bonding region can be efficiently absorbed by the groove.

Moreover, in the present invention, a plurality of continuous grooves reaching the circumference of the island may be formed in the island. For example, a plurality of continuous grooves reaching the circumference of the island may be formed between the die bonding region and the wire bonding region. Moreover, a groove branching off into a plurality of grooves may be formed in the island. When a groove branching off a plurality of grooves is formed, it is sufficient that a continuous groove reaching the circumference of the island is formed at least between the wire bonding region and the wire bonding region, and other groove branches do not necessarily reach the circumference of the island.

In the present invention, it is desirable that the area of a wire bonding region partitioned by the groove is smaller as long as within a range allowing wire bonding to the wire bonding region. This is because, when the area of the wire bonding region is smaller, a thermal expansion produced in the wire bonding region itself is smaller. Accordingly, it becomes possible to reduce displacement of the wire bonding region due to a thermal expansion. In addition, this is because, when the area of the wire bonding region is smaller, the area of a die bonding region partitioned by the groove becomes larger, so that a thermal expansion produced in the die bonding region is large. However, the thermal expansion of the die bonding region is absorbed by a groove formed between the die bonding region and the wire bonding region, whereby it is not transmitted to the wire bonding region.

Based on the points described above, it is desirable that a wire bonding region partitioned by the groove is located at a corner (for example, a corner of the island partitioned by extensions of two adjacent sides of a die bonding region) of the island. In addition, it is desirable that a suspension lead formed integrally with the island is located on the die bonding region side among the die bonding region and the wire bonding region isolated by the groove. This is because, existence of a groove between the suspension lead and the wire bonding region can prevent the wire bonding region from displacement due to a thermal expansion of the suspension lead.

In the present invention, the depth and the width of the groove are not particularly limited. However the depth and the width are $\frac{1}{3}$ to $\frac{3}{4}$ of the thickness of the island, because it is possible to sufficiently prevent the first wire from breaking due to a thermal expansion of the island while securing the strength of the island. In the present invention, the depth and the width of the groove are not necessarily uniform at all positions of the groove, and may be different depending on the position.

The resin used for forming the resin package portion is not particularly limited. Example of such type may include a resin composition containing a thermosetting epoxy resin as a main resin component, a phenol resin as a hardener component, and an inorganic filler. In addition, it is also possible to use a heat-resistant thermoplastic resin such as, for example, a PPS (polyphenylene sulfide) resin, and a PPE (polyphenylene ether) resin in place of the epoxy resin as the main resin component. In addition, the inorganic filler is not particularly limited. Examples of such type may include silica glass, crystalline silica, and fused silica.

In the present embodiment, a description has been given of the semiconductor device employing a package type of SOP (Small Out-line Package). However, in the present invention, the package type is not particularly limited. Examples of such type may include QFP (Quad Flat Package), QFN (Quad Flat Non-leaded package), QFJ (Quad Flat J leaded package), SOJ (Small Out-line J leaded package), DIP (Dual In-line Package), and SIP (Single In-line Package).

BRIEF DESCRIPTION OF THE DRAWINGS

FIG. 2(a) is a partial plan perspective view schematically showing another example of a semiconductor device according to the present invention, and FIG. 2(b) is a longitudinal sectional view schematically showing the semiconductor device;

FIG. 5(a) is a partial plan perspective view schematically showing an example of a conventional semiconductor device, and FIG. 5(b) is a longitudinal sectional view schematically showing the semiconductor device; and FIG. 6(a) is a partial plan perspective view schematically showing another example of a conventional semiconductor device, and FIG. 6(b) is a longitudinal sectional view schematically showing the semiconductor device.

Figure 1:
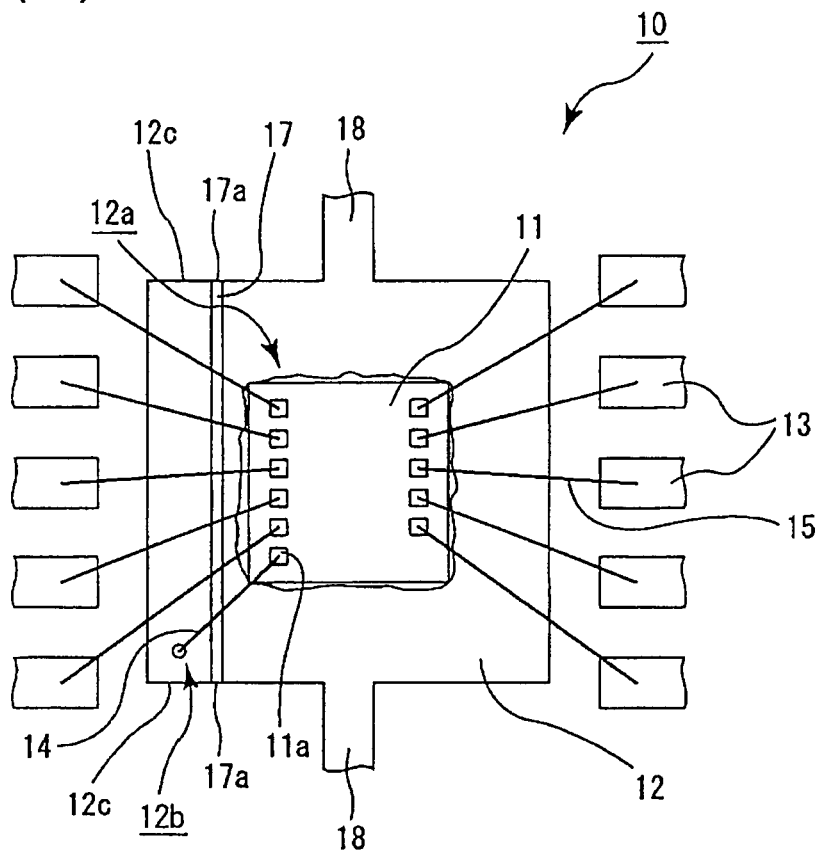
FIG. 1(a) is a partial plan perspective view schematically showing an example of a semiconductor device according to the present invention.
FIG. 1(b) is a longitudinal sectional view schematically showing the semiconductor device.
Figure 1:
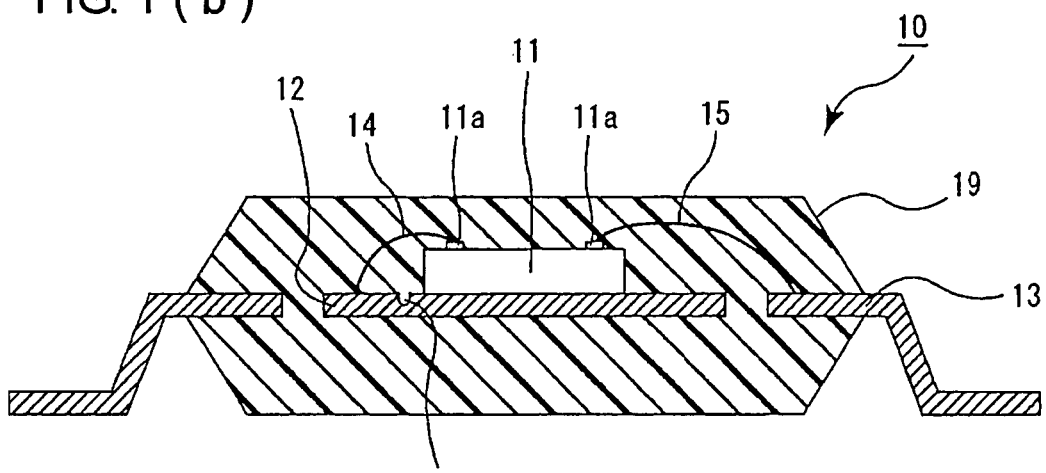
Figure 3:
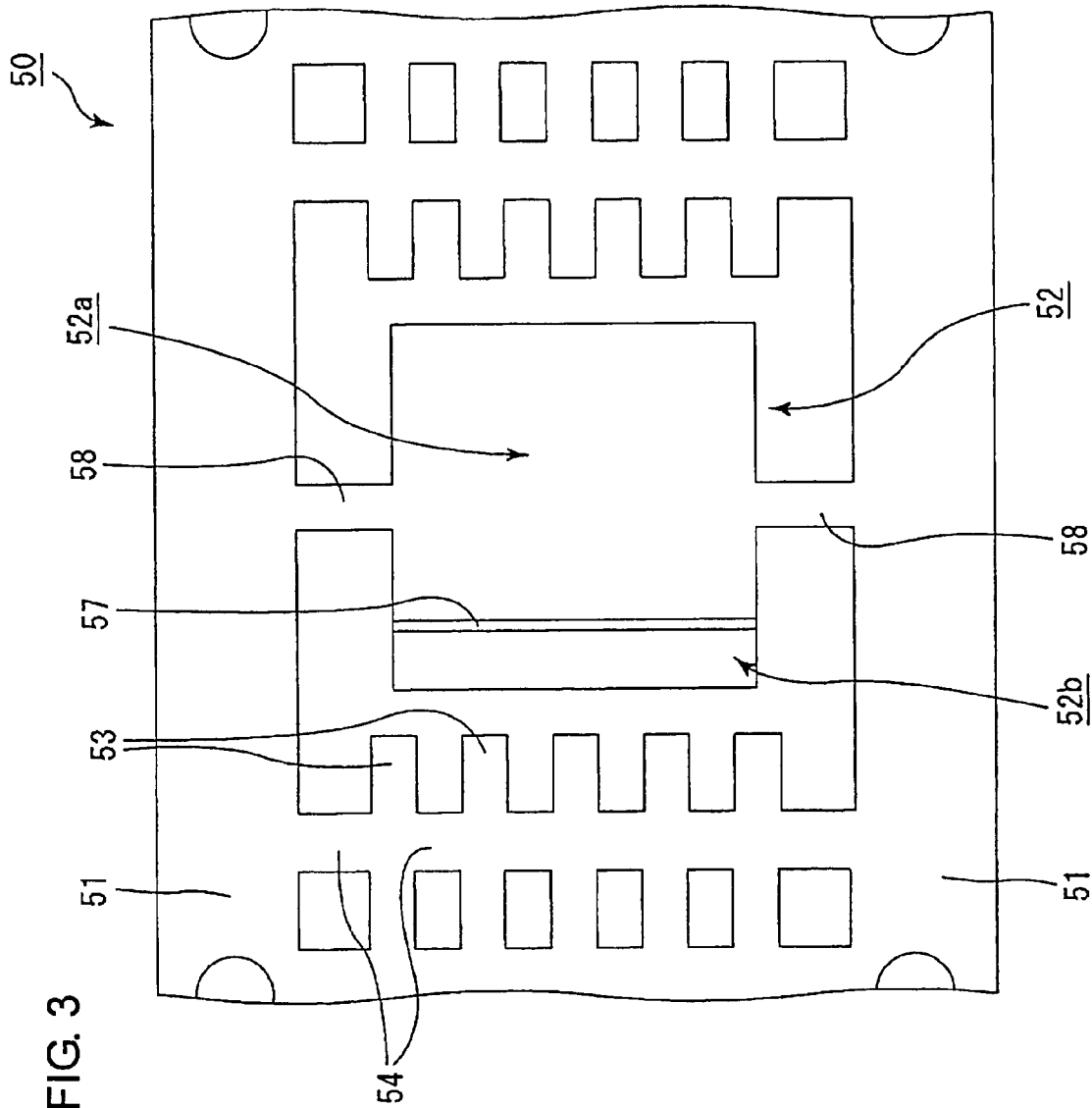
FIG. 3 is a plan view schematically showing an example of a lead frame according to the present invention.
Figure 4:
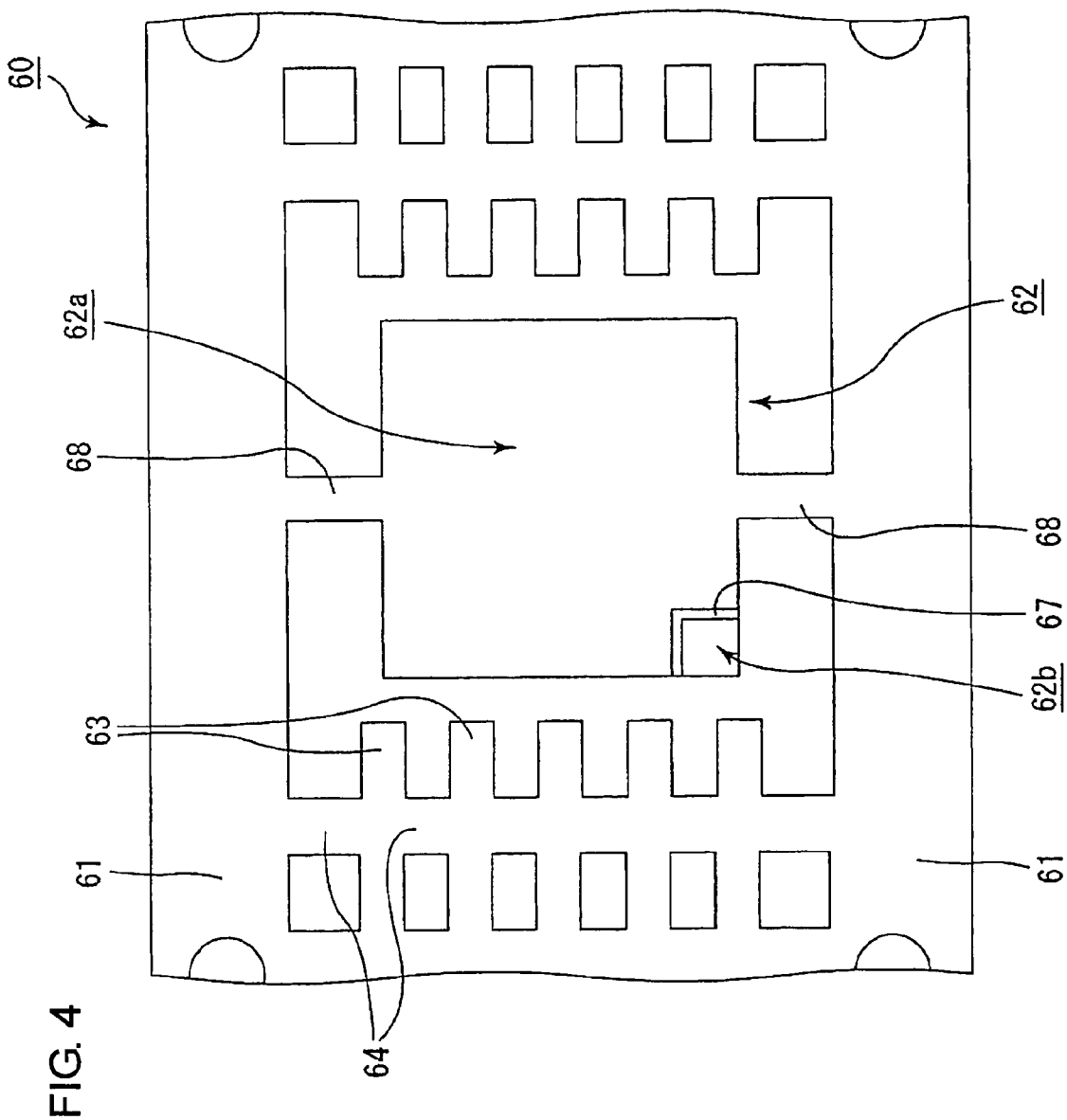
FIG. 4 is a plan view schematically showing another example of a lead frame according to the present invention.

DESCRIPTION OF THE SYMBOLS 10, 30 Semiconductor device
11, 31 Semiconductor chip
12, 32, 52, 62 Island
12a, 32a, 52a, 62a Die bonding region
12b, 32b, 52b, 62b Wire bonding region
12c Circumference (of island)
13, 33, 53, 63 Lead terminal
14, 34 First wire
15, 35 Second wire
17, 37, 57, 67 Groove
18, 38, 58, 68 Suspension lead
19, 39 Resin package portion
50, 60 Lead frame

What is claimed is:

1. A semiconductor device comprising:
a semiconductor chip;
an island die configured to be bonded with the semiconductor chip on a surface; and
a wire that electrically connects an electrode formed on a surface of the semiconductor chip with the island, wherein
the island has a die bonding region where semiconductor chip is configured to be die bonded and a wire bonding region located at a corner of the island where the wire is configured to be wire bonded,
a suspension lead is integrally formed with the die bonding region, and
a continuous groove reaching a circumference of the island is formed between the die bonding region and the wire bonding region of the island.

2. The semiconductor device according to claim 1, wherein the island is a rectangular shape, and
the groove is a continuous groove reaching each of two adjacent sides of the island.

3. The semiconductor device according to claim 1, wherein the shape of the groove is an arc shape centered on the corner of the island.

4. The semiconductor device according to claim 1, wherein the depth of the groove is $\frac{1}{3}$ to $\frac{3}{4}$ of the thickness of the island.

5. The semiconductor device according to claim 1, wherein the width of the groove is $\frac{1}{3}$ to $\frac{3}{4}$ of the thickness of the island.

6. A lead frame comprising:
an island having a die bonding region where a semiconductor chip is configured to be die bonded and a wire bonding region located at a corner of the island where a wire is configured to be wire bonded, wherein
a suspension lead is integrally formed with the die bonding region, and
a continuous groove reaching a circumference of the island is formed between the die bonding region and the wire bonding region of the island.

7. The lead frame according to claim 6, wherein
the island is a rectangular shape, and
the groove is a continuous groove reaching each of two adjacent sides of the island.

8. The lead frame according to claim 6, wherein the shape of the groove is an arc shape centered on the corner of the island.

9. The lead frame according to claim 6, wherein the depth of the groove is $\frac{1}{3}$ to $\frac{3}{4}$ of the thickness of the island.

10. The lead frame according to claim 6, wherein the width of the groove is $\frac{1}{3}$ to $\frac{3}{4}$ of the thickness of the island.

* * * * *